United States Patent
Kim et al.

(10) Patent No.: US 8,907,327 B2
(45) Date of Patent: Dec. 9, 2014

(54) DISPLAY DEVICE AND ORGANIC LIGHT-EMITTING DISPLAY DEVICE HAVING CONNECTION PART FOR ELECTRONICALLY CONNECTING DIFFERENT LEVELS OF CONDUCTORS

(71) Applicants: Byoung-Sun Kim, Yongin (KR); Kwang-Min Kim, Yongin (KR); Won-Se Lee, Yongin (KR)

(72) Inventors: Byoung-Sun Kim, Yongin (KR); Kwang-Min Kim, Yongin (KR); Won-Se Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/798,189

(22) Filed: Mar. 13, 2013

(65) Prior Publication Data

US 2014/0145153 A1     May 29, 2014

(30) Foreign Application Priority Data

Nov. 26, 2012    (KR) .......................... 10-2012-0134864

(51) Int. Cl.
*H01L 51/52*     (2006.01)
*H05K 1/02*      (2006.01)

(52) U.S. Cl.
CPC .......... *H01L 51/5296* (2013.01); *H05K 1/0298* (2013.01)

USPC .............................................................. 257/40

(58) Field of Classification Search
CPC ................................................. H01L 23/5283
See application file for complete search history.

(56) References Cited

U.S. PATENT DOCUMENTS

| 7,768,618 B2 | 8/2010 | Kang |
| 2011/0084257 A1 | 4/2011 | Kwon et al. |
| 2013/0049029 A1 * | 2/2013 | Kim et al. ....................... 257/88 |

FOREIGN PATENT DOCUMENTS

| KR | 10 2007-0068235 A | 6/2007 |
| KR | 10 2010-0066753 A | 6/2010 |
| KR | 10 2011-0036456 A | 4/2011 |
| KR | 10 2011-0039061 A | 4/2011 |

* cited by examiner

*Primary Examiner* — Stephen W Smoot
(74) *Attorney, Agent, or Firm* — Lee & Morse, P.C.

(57) ABSTRACT

A display device and organic light-emitting display device, the display device including a substrate; a first line on the substrate; a first pad electrically connected to the first line, the first pad being on a same layer as the first line; a second line on another layer different from the layer on which the first line is formed, an insulation layer being interposed between the first line and the second line; a second pad on a same layer as the first pad; and a connection part electrically connecting the second line and the second pad.

21 Claims, 6 Drawing Sheets

DISPLAY DEVICE AND ORGANIC LIGHT-EMITTING DISPLAY DEVICE HAVING CONNECTION PART FOR ELECTRONICALLY CONNECTING DIFFERENT LEVELS OF CONDUCTORS

CROSS-REFERENCE TO RELATED APPLICATION

This application claims the benefit of Korean Patent Application No. 10-2012-0134864, filed on Nov. 26, 2012, in the Korean Intellectual Property Office, the disclosure of which is incorporated herein in its entirety by reference.

BACKGROUND

1. Field

The embodiments relate to a display device and organic light-emitting display device.

2. Description of the Related Art

Recently, display devices have been replaced by portable thin flat panel display devices. Examples of flat panel display devices include a liquid crystal display device, as a light-receiving type display device, and an organic light-emitting display device and a plasma display device, as a light-emitting type display device.

SUMMARY

According to an embodiment, there is provided a display device including: a substrate; a first line formed on the substrate; a first pad that is electrically connected to the first line and formed on a same layer as the first line; a second line formed on another layer than that on which the first line is formed with the first line and an insulation layer interposed therebetween; a second pad formed on a same layer as the first pad; and a connection part connecting the second line and the second pad electrically.

A plurality of the first line and a plurality of the second line may be alternately disposed.

A plurality of the first pad and a plurality of the second pad may be alternately disposed to be staggered.

The device may further include: first and second insulation layers including a first opening that exposes a portion of the first pad; and a first protective layer covering the first pad exposed through the first opening.

The device may further include: first and second insulation layers including a second opening that exposes a portion of the second pad; and a second protective layer covering the second pad exposed through the second opening.

The second insulation layer may cover the second line and may include a contact hole to connect the second line and the connection part.

The device may further include: a first insulation layer including a first opening that exposes a portion of the first pad; and a first protective layer covering the first pad exposed through the first opening.

The device may further include: a first insulation layer including a second opening that exposes a portion of the second pad; and a second protective layer covering the second pad exposed through the second opening.

A second insulation layer and the first insulation layer may be formed on the second line; the first and second insulation layers may include a contact hole to connect the second line and the connection part; and the connection part and the second protective layer may be integrally formed.

A side of each of the first line and the second line may be connected to a display area where an image is displayed.

According to another embodiment, there is provided an organic light-emitting display device including: a substrate including a display area where an image is displayed and a non-display area around the display area; a plurality of first gate lines formed in the display area and extending in a first direction; a plurality of second gate lines formed in the display area, insulated from the first gate line by a first insulation layer, and extending in the first direction; a plurality of data lines formed in the display area, insulated from the second gate line by a second insulation layer, and extending in the second direction intersecting the first direction; a pixel including a driving circuit unit that is electrically connected to the first gate line or the second gate line and the data line; an organic light-emitting device included in the pixel and that is electrically connected to the driving circuit unit to emit light; pads disposed in the non-display area; and lines connecting the pads and the display area, wherein the lines include first lines and second lines formed on another layer than that on which the first line is formed and an insulation layer therebetween; the pads are electrically connected to the first line and include first pads formed on a same layer as the first line and a second pad formed on a same layer as the first pad; and a connection part is further included to electrically connect the second line and the second pad.

A plurality of the first line and a plurality of the second line may be alternately disposed.

A plurality of the first pad and a plurality of the second pad may be alternately disposed to be staggered.

The first line and the first pad may be integrally formed.

The first pad may be formed on a same layer as the first gate line; the first and second insulation layers may include a first opening that exposes a portion of the first pad; and a first protective layer may be further included to cover the first pad exposed through the first opening.

The second pad may be formed on a same layer as the first gate line; the first and second insulation layers may include a second opening that exposes a portion of the second pad; and further comprising a second protective layer to cover the second pad exposed through the second opening.

The second line may be formed on a same layer as the second gate line; the second insulation layer may include a contact hole to cover the second line and connect the second line and the connection part; and the connection part and the second protective layer may be integrally formed.

The first pad may be formed on a same layer as the second gate line; the second insulation layer may include a first opening that exposes a portion of the first pad; and further comprising a first protective layer to cover the first pad exposed through the first opening.

The second pad may be formed on a same layer as the second gate line; the second insulation layer may include a second opening that exposes a portion of the second pad; and further comprising a second protective layer to cover the second pad exposed through the second opening.

The second line may be formed on a same layer as the first gate line; the first and second insulation layers may include a contact hole to connect the second line and the connection part; and the connection part and the second protective layer may be integrally formed.

BRIEF DESCRIPTION OF THE DRAWINGS

The embodiments will become more apparent by describing in detail exemplary embodiments thereof with reference to the attached drawings in which.

DETAILED DESCRIPTION

Figure 1:
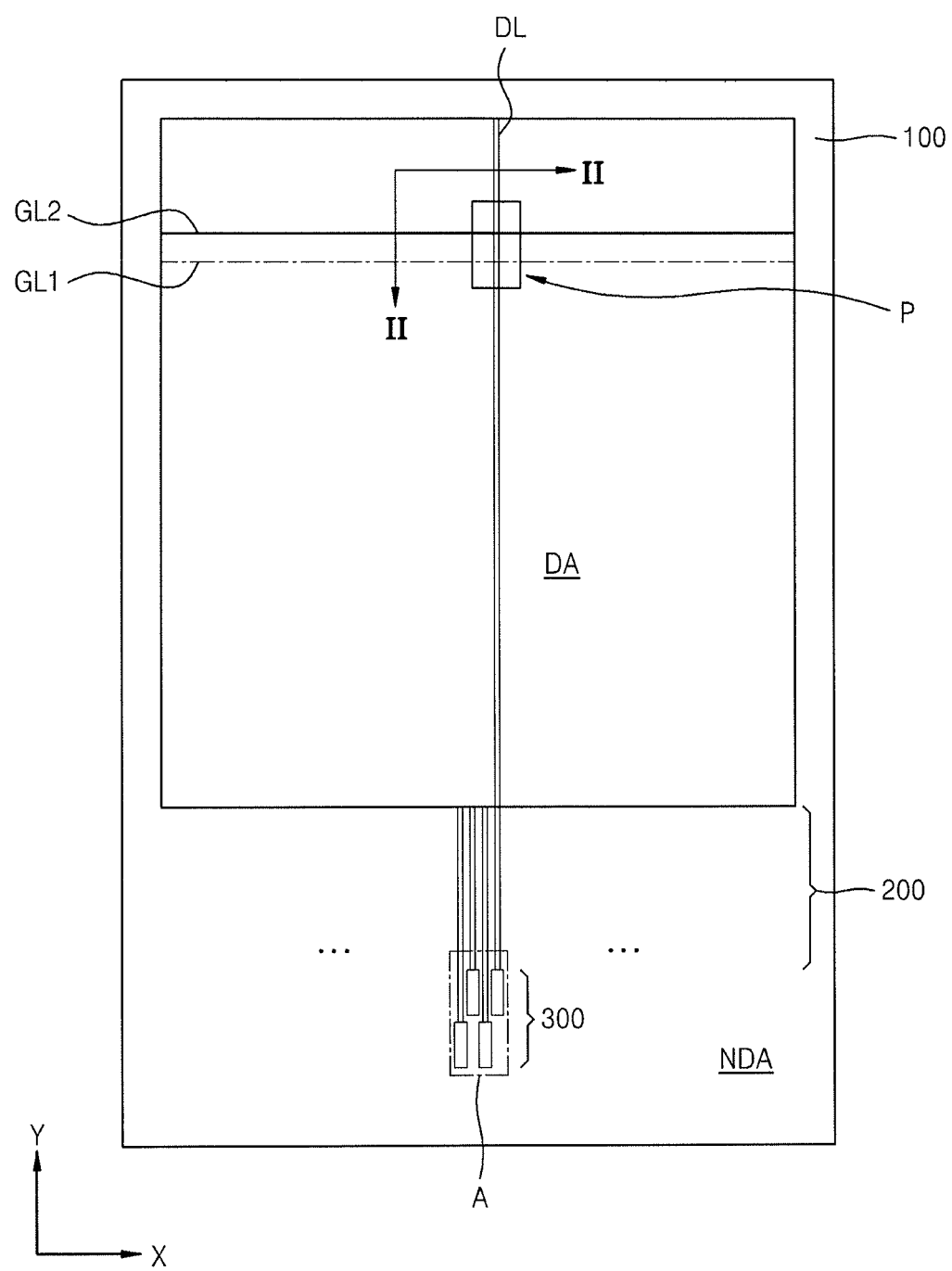
FIG. 1 illustrates a view of a display substrate of an organic light-emitting display device according to an embodiment.

Hereinafter, embodiments will be described in more detail with reference to the accompanying drawings, in order to allow one of ordinary skill in the art to easily realize the embodiment. The embodiments may be realized in different forms, and is not limited to the embodiments described herein.

Moreover, detailed descriptions related to well-known functions or configurations will be ruled out in order not to unnecessarily obscure subject matters of the embodiments. Like reference numerals refer to like elements throughout.

Although terms like 'first' and 'second' may be used to describe various components, the components are not limited to the terms. These terms are used only to distinguish one component from other components. For example, a first pad, a second pad, a first line, and a second line in claims 8 to 10 may refer to a second a pad, a first pad, a second fan-out line, and a first fan-out line in FIGS. 8 to 10, respectively.

In this specification, when a portion of a layer, a film, a region, and a plate is referred to as being "on" another portion, it can be directly on the other portion, or intervening portions may also be present.

In the drawings, in order to clearly express several layers and regions, their thicknesses may be enlarged. Also, in the drawings, the thicknesses of layers and regions may be exaggerated for clarity.

As used herein, the term "and/or" includes any and all combinations of one or more of the associated listed items. Expressions such as "at least one of," when preceding a list of elements, modify the entire list of elements and do not modify the individual elements of the list.

Hereinafter a display device according to an embodiment will be described in more detail with reference to the drawings. In this embodiment, although an organic light-emitting display device is exemplarily described as a display device, this is merely one example. Thus, the embodiments may be applied to all display devices including pads in a non-display area, for example, a liquid crystal display device, a plasma display device, and so on.

Figure 2:
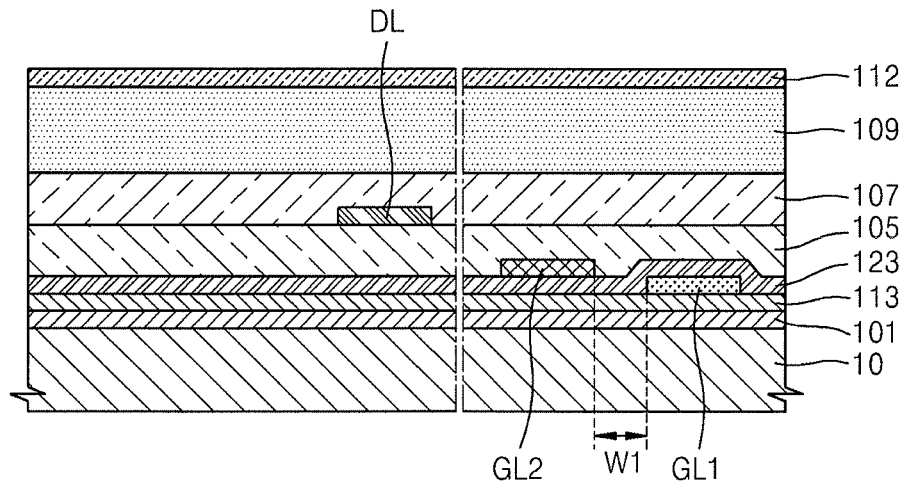
FIG. 2 illustrates a cross-sectional view taken along line II-II of FIG. 1.
Figure 3:
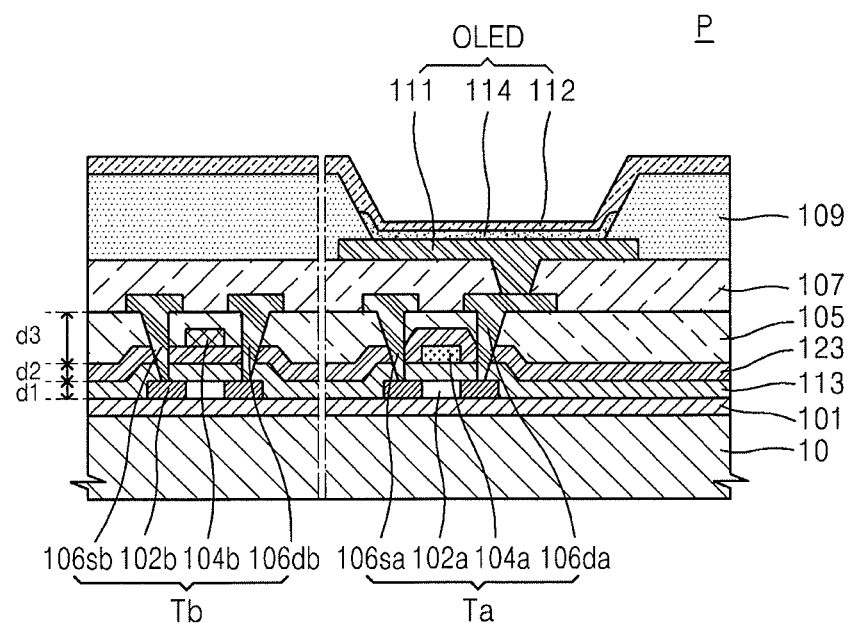
FIG. 3 illustrates an enlarged view of a pixel portion of FIG. 1.
Figure 4:
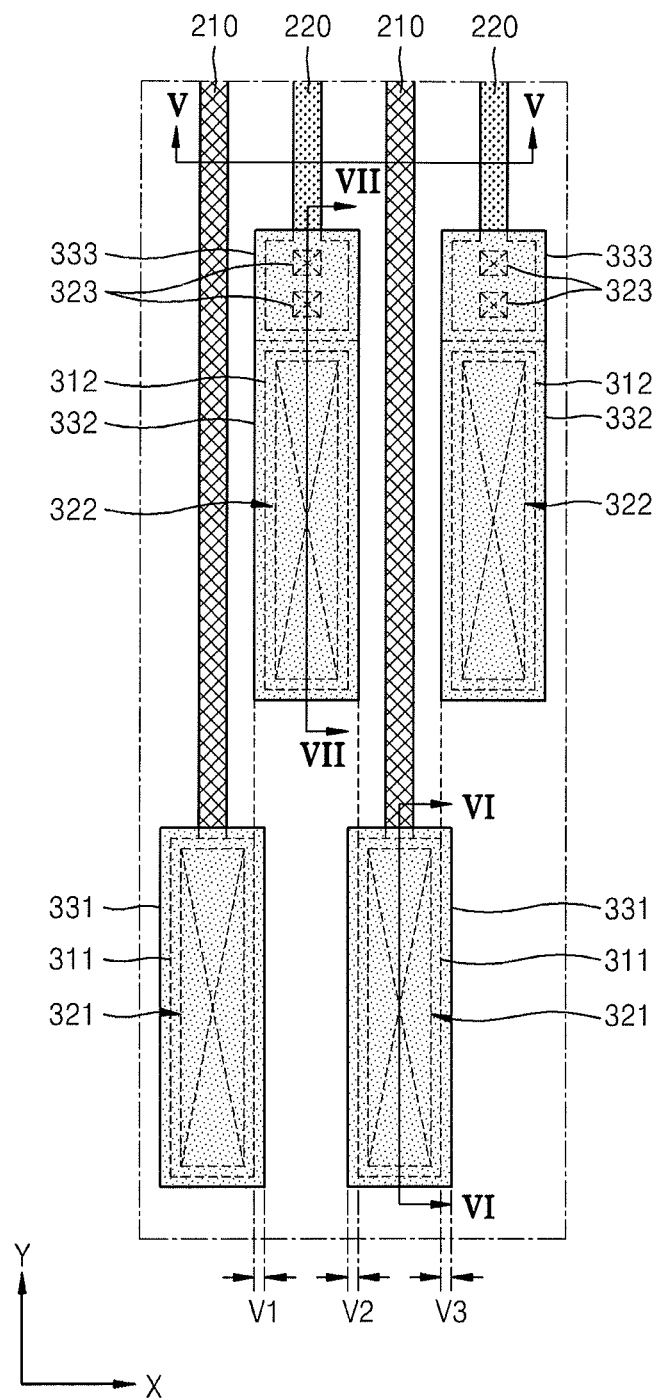
FIG. 4 illustrates an enlarged view of region A of FIG. 1.
Figure 5:
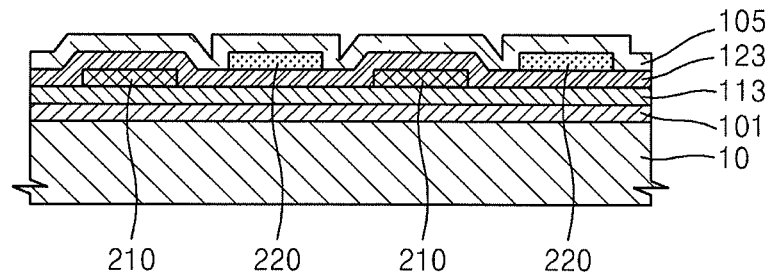
FIG. 5 illustrates a cross-sectional view taken along line V-V of FIG. 4.
Figure 6:
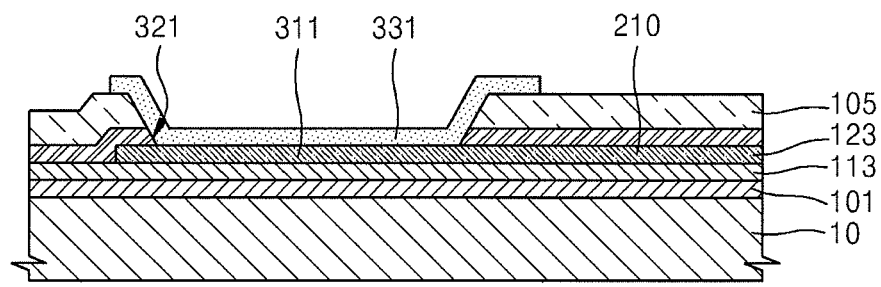
FIG. 6 illustrates a cross-sectional view taken along line VI-VI of FIG. 4.
Figure 7:
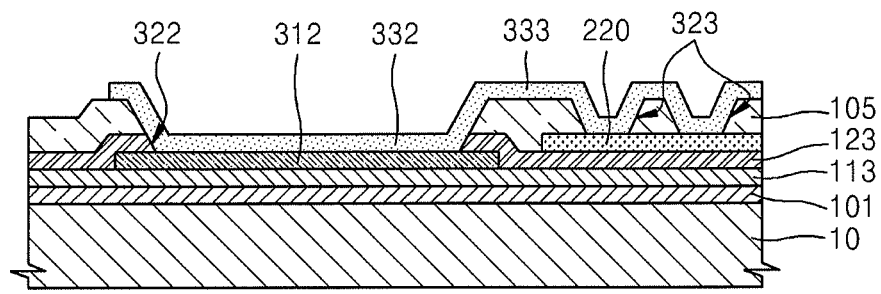
FIG. 7 illustrates a cross-sectional view taken along line VII-VII of FIG. 4.

FIG. 1 illustrates a view of a display substrate 100 of an organic light-emitting display device according to an embodiment. FIG. 2 illustrates a cross-sectional view taken along line II-II of FIG. 1. FIG. 3 illustrates an enlarged view of a pixel portion of FIG. 1. FIG. 4 illustrates an enlarged view of region A of FIG. 1. FIG. 5 illustrates a cross-sectional view taken along line V-V of FIG. 4. FIG. 6 illustrates a cross-sectional view taken along line VI-VI of FIG. 4. FIG. 7 illustrates a cross-sectional view taken along line VII-VII of FIG. 4.

Referring to FIG. 1, the organic light-emitting display device according to an embodiment may include the display substrate 100 and a sealing substrate (not shown). The display substrate 100 may include a display area DA where an image is displayed and a non-display area NDA, where no image is displayed, around the display area DA. Although not shown in the drawings, a sealing member may be disposed on the non-display area NDA to surround the display area DA in order to attach the sealing substrate that seals the display area DA from air. However, if the sealing substrate has a thin film encapsulation form, a sealing member may be omitted. The sealing substrate, though not shown in FIG. 1, may be disposed to face the display substrate 100 with a sealing member therebetween. Hereinafter, the display substrate 100 having the features of the embodiments is described.

First, referring to FIGS. 1 to 3, the display area DA of the display substrate 100 will be described in more detail.

Referring to FIGS. 1 to 3, one first gate line GL1, one second gate line GL2, one data line DL, and one pixel P are shown, but this is just exemplary. A plurality of gate lines, data lines, and pixels may be disposed in the entire display area DA. Referring to FIGS. 1 to 3, the display area DA is an area where an image is displayed and various signal lines and pixels P that are connected to the various signal lines are disposed. The signal lines include first gate lines GL1 and second gate lines GL2 extending in a first direction X and data lines DL extending in a second direction Y. The pixels P may be disposed at the intersection areas of the first and second gate lines GL1 and GL2 and the data lines DL.

The first gate lines GL1 may be disposed on a first gate insulation layer 113 and may extend in a first direction X. The first gate lines GL1 may include a previous scan line and a light-emitting control line, but is not limited thereto. The first gate lines GL1 may be connected to a gate driving unit (not shown) or a control driving unit (not shown) to receive a scan signal or a light-emitting control signal, but is not limited thereto.

The second gate lines GL2 may be insulated from the first gate lines GL1 with a second gate insulation layer 123 therebetween and may extend in the first direction X. The second gate lines GL2 may include a scan line and an initializing power line, but is not limited thereto. The second gate lines GL1 may be connected to a gate driving unit (not shown) or an initializing power driving unit (not shown) to receive a scan signal or an initializing power, but is not limited thereto.

The first gate lines GL1 and the second gate lines GL2 may not overlap each other. For example, the first gate lines GL1 may not overlap the second gate lines GL2. Like this, in relation to the display substrate 100, the first gate lines GL1 and the second gate lines GL2, i.e. gate lines, may be separately disposed on different layers with the second gate insulation layer 123 therebetween, so that a distance W1 between adjacent gate lines on different layers may be narrow. As a result, more pixels P may be formed in the same area. For example, a high resolution display device may be formed.

The types of signal lines that the first gate lines GL1 and the second gate lines GL2 configure, the types of signals that a signal line provides, and the types, number, and positions of driving units to which a signal line is connected are not limited to the above description, and may vary.

The data lines DL may be insulated from the gate lines GL1 and GL2 by an interlayer insulation layer 105 therebetween and may extend in a second direction Y intersecting the first direction X. The data lines DL may be connected to a driver IC (not shown), a pad, and a fan-out line in a non-display area. The data line DL receives a data signal from the driver IC through fan-out lines.

A plurality of pixels P may be disposed at the intersection areas of the data lines DL and the first gate lines GL1 and the second gate lines GL2. The pixels P may emit red, green, or blue light, but are not limited thereto. In an implementation, the pixels P may emit white light.

A pixel P may include an organic light-emitting diode (OLED) for emitting light with a brightness corresponding to a driving current in response to a data signal and a pixel circuit (or a driving circuit) for controlling a driving current that flows in the OLED. The pixel circuit may be connected to each of the first gate lines GL1, the second gate lines GL2, and the data lines DL, and the OLED is connected to the pixel circuit. The pixel circuit may include a plurality of thin film transistors (TFTs) Ta and Tb and at least one capacitor (not shown).

Referring to FIG. 3, the structure of the pixel P including a pixel circuit and an OLED will be described in more detail.

Moreover, although two transistors and an OLED in the pixel P are shown in FIG. 3, the pixel P may further include an additional TFT and capacitor in addition to the shown components.

The pixel P may be formed on a substrate 10. The substrate 10 may be formed of a glass material, a plastic material, or a metallic material. In an implementation, in order to realize a free folding or flexible display device, the substrate may be formed of a flexible material, e.g., a polyimide film.

A buffer layer 101 may be formed on the substrate 10 in order to provide a flat surface and to help prevent penetration of moisture and foreign materials in the direction of the substrate 10, and the buffer layer 101 may include an insulation material.

The pixel circuit may be formed on the buffer layer 101. The pixel circuit may include the TFTs, namely, first and second TFTs Ta and Tb, a capacitor (not shown), and the OLED that is connected to the pixel circuit. The TFTs Ta and Tb mainly include active layers 102a and 102b, gate electrodes, namely, first and second gate electrodes 104a and 104b, and source/drain electrodes 106sa, 106da, 106sb, and 106db. In the first and second TFTs Ta and Tb, the first and second gate electrodes 104a and 104b may be formed on different layers.

For example, in the case of the first TFT Ta, the active layer 102a having a predetermined pattern may be disposed on the buffer layer 101. The active layer 102a may contain an inorganic semiconductor material such as silicon, an organic semiconductor material, or an oxide semiconductor material including an oxide such as In, Ga, Sn, Hf, and/or Zn. In an implementation, if desired, a p-type or an n-type dopant may be implanted. The first gate insulation layer 113 may be formed on the active layer 102a. The first gate insulation layer 113 may be formed on the active layer 102a. The second gate insulation layer 123 and the interlayer insulation layer 105 may cover the first gate electrode 104a, and the source/drain electrodes 106sa and 106da may be formed on the interlayer insulation layer 105 to contact a predetermined area of the active layer 102a.

Then, in the case of the second TFT Tb, the active layer 102b having a predetermined pattern may be disposed on the buffer layer 101, and the first gate insulation layer 113 and the second gate insulation layer 123 may be formed on the active layer 102b. The second gate electrode 104b may be formed on the second gate insulation layer 123 in correspondence to the active layer 102b. The interlayer insulation layer 105 may be formed to cover the second gate electrode 104b, and the source/drain electrodes 106sb and 106db may be formed on the interlayer insulation layer 105 to contact a predetermined area of the active layer.

Here, the first gate insulation layer 113 and the second gate insulation layer 123 may include a monolayer or multilayer structure formed of an inorganic substance such as a silicon oxide or a silicon nitride. Additionally, the interlayer insulation layer 105 may include a monolayer or multilayer structure formed of an inorganic substance such as a silicon oxide or a silicon nitride. A thickness d3 of the interlayer insulation layer 105 may be formed thicker than a thickness d1 of the first gate insulation layer 113 or a thickness d2 of the second gate insulation layer 123 in order to planarize the surface of the substrate 10, and prevent the occurrence of a parasitic capacitance between the source/drain electrodes 106sa, 106sb, 106da, and 106db and a lower conductive layer.

Moreover, as mentioned above, by varying the thicknesses d1 and d1+d2 between the first and second gate electrodes 104a and 104b and the active layers 102a and 102b in each of the first and second TFTs Ta and Tb, the following effect may be obtained: First, when a TFT used as a driving TFT is formed to have a thick gate insulation layer, the driving range of a gate voltage may become broader, so that the size of the gate voltage applied to the gate electrode of the driving TFT varies. As a result, the light emitted from an OLED may be controlled to have richer gradation. Moreover, when a TFT used as a switching TFT is formed to have a thin gate insulation layer, it may perform a turn-on or turn-off operation fast, and may reduce a parasitic capacitance occurring between a gate electrode and an active layer. Accordingly, an optimal pixel circuit structure for an OLED may be realized.

A passivation layer 107 may be formed to cover the source/drain electrodes 106sa, 106sb, 106da, and 106db of the first and second TFTs Ta and Tb. An additional insulation layer may be further formed on the passivation layer 107 for planarization.

The OLED may be formed on the passivation layer 107. The OLED may include a first electrode 111, a second electrode 112, and an interlayer 114.

The first electrode 111 may be formed on the passivation layer 107. The first electrode 111 may be electrically connected to one of the source/drain electrodes 106sa, 106sb, 106da, and 106db. Also, a pixel definition layer 109 may cover the first electrode 111. After a predetermined opening is formed in the pixel definition layer 109, the interlayer 114 may be formed in the area defined by the opening, wherein the interlayer 114 includes an organic light-emitting layer. The second electrode 112 may be formed on the interlayer 114.

Moreover, when the OLED is a full-color OLED, an organic light-emitting layer may be patterned into a red light-emitting layer, a green light-emitting layer, and a blue light-emitting layer according to a red sub-pixel, a green sub-pixel, and a blue sub-pixel.

Additionally, the organic light-emitting layer may have a multilayer structure in which a red light-emitting layer, a green light-emitting layer, and a blue light-emitting layer are stacked to emit white light, or may have a monolayer structure including a red light-emitting material, a green light-emitting material, and a blue light-emitting material. The OLED including such an organic light-emitting layer may further include a red color filter, a green color filter, and a blue color filter in order to emit full color light. When the organic light-emitting display device is a bottom emission type display device that emits light toward the substrate 10, the first electrode 111 may be formed as a transparent electrode and the second electrode 112 may be formed as a reflective electrode. Furthermore, when the organic light-emitting display device is a top emission type display device that emits light toward the opposite direction of the substrate 10, the first electrode 111 may be formed as a reflective electrode and the second electrode 112 may be formed as a semi-transparent electrode. Furthermore, when the organic light-emitting display device is a dual emission type display device, the first electrode 111 may be formed as a transparent electrode and the second electrode 112 may be formed as a semi-transparent electrode.

Although not shown in the drawing, each pixel may have a transparent window structure that allows external light to penetrate, and thus a transparent display device may be implemented.

Then, referring to FIG. 1 and FIGS. 4 to 7, the non-display area NDA of the display substrate 100 will be described in more detail.

Referring to FIG. 1 and FIGS. 4 to 7, the non-display area NDA is an area where no image is displayed and various members for driving the display area DA and other modules are included. A driver IC (not shown), pads 300 connecting the driver IC (not shown) and the display area DA, and a fan-out part 200 may be formed in the non-display area NDA The driver IC may include a data driving unit for supplying a data signal, and may further include various functional units necessary for driving the display area DA. The driver IC may be mounted on the display substrate 100 as a chip on glass (COG) type. A contact terminal (not shown) electrically contacting the pads 300 on the display substrate 100 may be disposed at one side of the driver IC. A conductive adhesive material may be interposed between the pads 300 and the contact terminal (not shown), including a conductive ball, so that the pads 300 and the contact terminal (not shown) may be bonded to each other. Examples of such an adhesive material may include an anisotropic conductive film and a self organizing conductive film.

The pads 300 may be formed on the display substrate 100, and may electrically contact the contact terminal of the driver IC. The pads 300 may extend from fan-out lines, namely, first and second fan-out lines 210 and 220, respectively.

The pads 300 may include first pads 311 and second pads 312. The first pad 311 and the second pad 312 may be distinguished from each other according to the layers of the connected first and second fan-out lines 210 and 220. For example, the first pad 311 may be a pad extending from the first fan-out line 210 described below and the second pad 312 may be a pad extending from the second fan-out line 220 described below. The first pads 311 and the second pads 312 may be alternately disposed.

The first pad 311 may be formed at the first position of the non-display area NDA. The second pad 312 may be formed at the second position of the non-display area NDA. The second position is not on the same line as the first position in a first direction X. Accordingly, the first pad 311 and the second pad 312 may not be lined up on the same line and may be alternately disposed. When the first pads 311 and the second pads 312 are alternately disposed as described above, they may overlap each other by areas V1, V2, and V3 shown in FIG. 4. By doing so, according to an embodiment, many pads 300 may be disposed in a narrow space in the X direction. As a result, a dead space in the non-display area NDA may be reduced.

The first and second fan-out lines 210 and 220 may be disposed between the pads 300 and the display area DA in order to connect them. The plurality of first fan-out lines 210 and the plurality of second fan-out lines 220 may be alternately disposed.

The first fan-out line 210 may be formed on the first gate insulation layer 113. The first fan-out line 210 may be disposed on the same layer as the first gate line GL1 and may be formed of the same material as the first gate line GL1. One side of the first fan-out line 210 may be connected to the first pad 311, and the other side thereof may be connected to the display area DA, for example, the data line DL of the display area DA. The first fan-out line 210 may deliver a data signal from a driver IC (not shown) to the data line DL.

The second fan-out line 220 may be formed on the second gate insulation layer 123. The second fan-out line 220 may be disposed on the same layer as the second gate line GL2 and may be formed of the same material as the second gate line GL2. One side of the second fan-out line 220 may be connected to the second pad 312, and the other side thereof may be connected to the display area DA, for example, the data line DL of the display area DA. The second fan-out line 220 may deliver a data signal from a driver IC to the data line DL.

The first fan-out line 210 and the second fan-out line 220 may be insulated from each other by the second gate insulation layer 123 therebetween, and may be formed on different layers. The first fan-out lines 210 and the second fan-out lines 220 may not overlap each other. The reason is that since the thickness d2 of the second gate insulation layer 123 between the first fan-out line 210 and the second fan-out line 220 is relatively thin, if the first fan-out lines 210 and the second fan-out lines 220 overlap each other, a parasite capacitance in a line area becomes larger.

FIG. 6 illustrates a cross-sectional view of a first fan-out line 210 and a first pad 311 that is electrically connected to the first fan-out line 210.

The first pad 311 may be formed on the first gate insulation layer 113. Since the first fan-out line 210 is also formed on the first gate insulation layer 113, the first pad 311 and the first fan-out line 210 may be integrally formed. The second gate insulation layer 123 and the interlayer insulation layer 105 may be formed on the first pad 311 and the first fan-out line 210. Since the first pad 311 needs to contact a driver IC (not shown), a first opening 321 may be formed in the second gate insulation layer 123 and the interlayer insulation layer 105 on the first pad 311 in order to expose the first pad 311. Accordingly, the second gate insulation layer 123 and the interlayer insulation layer 105 may cover the edge of the first pad 311, and the first opening 321 may expose the center of the first pad 311. However, since the first fan-out line 210 needs to be insulated from the outside, no opening may be formed in the insulation layers formed on the first fan-out line 210.

The first fan-out line 210 and the first pad 311 may be formed of the same material. For example, the first fan-out line 210 and the first pad 311 may include a monolayer or a multilayer structure formed of a low-resistance metallic material including at least one of Mo, Al, Cu, Ag, and Ti. However, since a portion exposed to the outside, such as the first pad 311, is formed of a metallic material, it may be vulnerable to damage or corrosion. Accordingly, a first protective layer 331 may be formed on the first pad 311 exposed by the first opening 321.

The first protective layer 331 may cover portions of the first pad 311, the second gate insulation layer 123, and the interlayer insulation layer 105, exposed through the first opening 321. The first protective layer 331 may help prevent corrosion of the first pad 311 and separation between the first pad 311 and the insulation layers, so that it serves to improve a pad reliability. The first protective layer 331 may include a monolayer or a multilayer structure containing at least one of low-resistance metallic materials such as Mo, Al, Cu, Ag, and Ti and transparent conductive oxides (TCOs). Here, the TCO may include at least one of an indium tin oxide (ITO), an indium zinc oxide (IZO), a zinc oxide (ZnO), an indium oxide ($In_2O_3$), an indium gallium oxide (IGO), and an aluminium zinc oxide (AZO).

FIG. 7 illustrates a cross-sectional view of a second fan-out line 220 and a second pad 312 that is electrically connected to the second fan-out line 220.

Like the first pad 311, the second pad 312 may be formed on the first gate insulation layer 113. However, since the second fan-out line 220 is formed on the second gate insulation layer 123, it requires a structure for connecting to the second pad 312 on a different layer. Accordingly, in the present embodiment, the second pad 312 may be connected to the second fan-out line 220 through a connection part 333.

Like the first pad 311, the second gate insulation layer 123 and the interlayer insulation layer 105 may be formed on the second pad 312. Since the second pad 312 needs to contact a driver IC (not shown), a second opening 322 may be formed in the second gate insulation layer 123 and the interlayer insulation layer 105 on the second pad 312 in order to expose the second pad 312. Accordingly, the second gate insulation layer 123 and the interlayer insulation layer 105 may cover the edge of the second pad 312, and the second opening 322 may expose the center of the second pad 312. Moreover, the interlayer insulation layer 105 may be formed on the second fan-out line 220. Since the second fan-out line 220 needs to be protected from the outside, it is covered by the interlayer insulation layer 105. However, since the second fan-out line 220 needs to be electrically connected to the second pad 312, a contact hole 323 may be formed in the interlayer insulation layer 105 in order to connect the second fan-out line 220 and the connection part 333. Here, the number, position, and shape of contact holes 323 are not limited, and thus, may be variously realized.

The second fan-out line 220 and the second pad 312 may be formed of different materials. For example, the second fan-out line 220 and the second pad 312 may include a monolayer or a multilayer structure formed of a low-resistance metallic material including at least one of Mo, Al, Cu, Ag, and Ti. However, the embodiments are not limited thereto. Thus, the second fan-out line 220 and the second pad 312 may be formed of the same materials. However, since a portion exposed to the outside such as the second pad 312 is formed of a metallic material, it may be vulnerable to damage or corrosion. Accordingly, a second protective layer 332 may be formed on the second pad 312 exposed by the second opening 322.

The second protective layer 332 may cover portions of the second pad 312, the second gate insulation layer 123, and the interlayer insulation layer 105, exposed through the second opening 322. The second protective layer 332 may help prevent corrosion of the second pad 312 and separation between the second pad 312 and the insulation layers, so that it serves to improve a pad reliability. The second protective layer 332 may include a monolayer or a multilayer structure containing at least one of low-resistance metallic materials such as Mo, Al, Cu, Ag, and Ti and TCOs. Here, the TCO may include at least one of an ITO, an IZO, a ZnO, an $In_2O_3$, an IGO, and an AZO.

Moreover, the connection part 333 and the second protective layer 332 may be integrally formed. Accordingly, the connection part 333 may connect the second fan-out line 220 and the second protective layer 332 through the contact hole 323 formed in the interlayer insulation layer 105 on the second fan-out line 220. The second protective layer 332 may directly contact the second pad 312. Since the second protective layer 332 may be formed of the above-mentioned conductive material, the second pad 312 may be electrically connected to the second fan-out line 220 consequentially.

According to an embodiment, by forming the pads 300 on the same layer, bonding defects between a driver IC (not shown) and the pads 300 due to the height differences of the pads 300 may be prevented. For example, there may be the buffer layer 101 and the first gate insulation layer 113 below the first pads 311, and there may be the buffer layer 101 and the first gate insulation layer 113 below the second pads 312. Accordingly, the first pads 311 and the second pads 312 may be spaced apart from the substrate 10 by a height that is the thicknesses of the buffer layer 101 and the first gate insulation layer 113. For example, the pads 300 may be disposed at a predetermined height from the substrate 10. In this case, when a driver IC (not shown) and the pads 300 are bonded to each other by using an adhesive material, bonding defects may be prevented.

However, if a second pad and a second fan-out line were to be formed on the same layer according to a comparative example, there may be a buffer layer, a first gate insulation layer, and a second gate insulation layer below the second pad. Accordingly, compared to a first pad, there may be a height difference due to the thickness of the second gate insulation layer. In this case, since gaps between a driver IC terminal and a pad surface may occur, through which air, moisture, and foreign materials may penetrate, adhesive bonding may become difficult to perform and the reliability after the bonding may not be maintained. However, by removing the height differences between pads through a connection part according to an embodiment, the above limitations may be resolved and the reliability after the bonding may be improved.

Moreover, according to an embodiment, the connection part 333 may be formed together with the first and second protective layers 331 and 332, so that manufacturing processes may become simplified and contact reliability may be further improved.

Additionally, according to an embodiment, by distributing and forming fan-out lines, which area usually formed on the same layer, on different layers, the size of a fan-out part may be reduced. By doing so, dead spaces may be reduced and more lines may be disposed on the fan-out part. Therefore, more lines may be formed in the same area and a high-resolution display device may be manufactured. Furthermore, a high resolution may be realized by a small panel.

Figure 8:
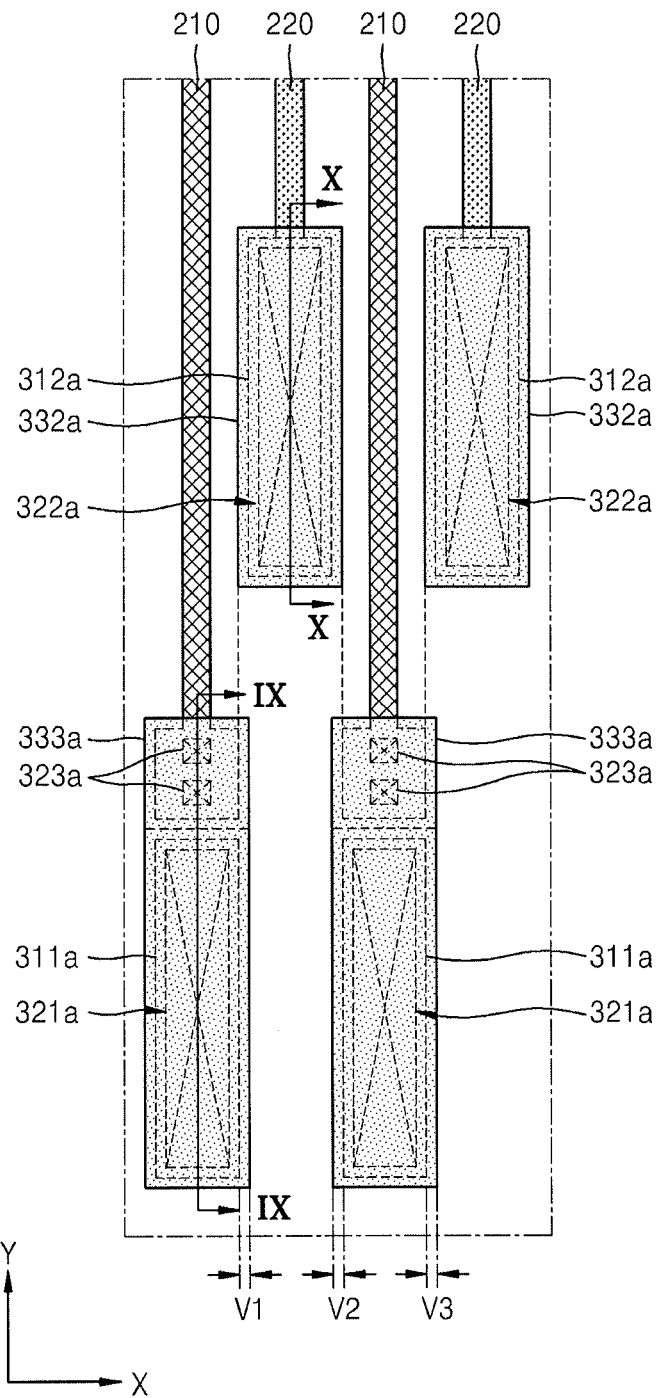
FIG. 8 illustrates an enlarged view of region A of FIG. 1 according to another embodiment.
Figure 9:
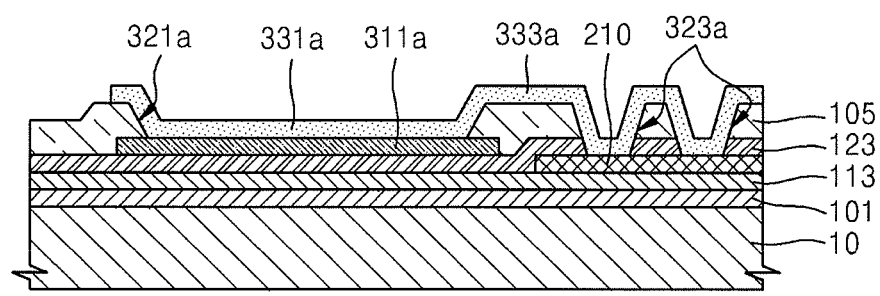
FIG. 9 illustrates a cross-sectional view taken along line IX-IX of FIG. 8.
Figure 10:
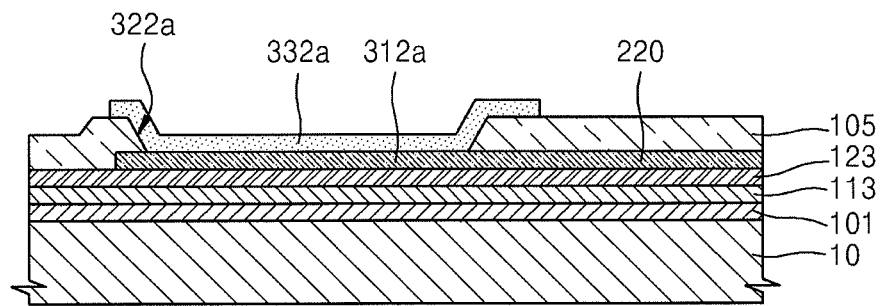
FIG. 10 illustrates a cross-sectional view taken along line X-X of FIG. 8.

FIG. 8 illustrates an enlarged view of region A of FIG. 1 according to another embodiment. FIG. 9 illustrates a cross-sectional view taken along line IX-IX of FIG. 8. FIG. 10 illustrates a cross-sectional view taken along line X-X of FIG. 8.

According to the present embodiment shown in FIGS. 8 to 10, compared to the previous embodiment, there may be a difference in forming the pads 300 on the second gate insulation layer 123. The components of FIGS. 8 to 10 that are indicated with the same reference numerals as those of FIGS. 1 to 7 have the same functions and actions, and thus repeated descriptions thereof may be omitted. Hereinafter, features related to FIGS. 8 to 10 are mainly described.

Referring to FIGS. 8 and 9, a first a pad 311a may be formed on the second gate insulation layer 123. However, since the first fan-out line 210 may be formed on the first gate insulation layer 113, it requires a structure for connecting to the first a pad 311a on a different layer. Accordingly, in the present embodiment, the first a pad 311a may be connected to the first fan-out line 210 through a connection part 333a.

The interlayer insulation layer 105 may be formed on the first a pad 311a. Since the first a pad 311a needs to contact a driver IC (not shown), a first opening 321a may be formed in the interlayer insulation layer 123 on the first a pad 311a in order to expose the first a pad 311a. Moreover, since the first fan-out line 210 needs to be insulated from the outside, it may be covered by the second gate insulation layer 123 and the interlayer insulation layer 105. However, since the first fan-out line 210 needs to be electrically connected to the first a pad 311a, a contact hole 323a may be formed in the second gate insulation layer 123 and the interlayer insulation layer 105 to connect the first fan-out line 210 and the connection part 333a.

The first a pad 311a may be formed of the above-mentioned metallic material, but may be exposed to the outside. As a result, the first a pad 311a may be vulnerable to corrosion or damage. Accordingly, a first a protective layer 331a may be formed on the first a pad 311a exposed by the first a opening 321a.

The first a protective layer 331a may cover portions of the first a pad 311a and the interlayer insulation layer 105, exposed through the first opening 321a. The first protective layer 331a may help prevent corrosion of the first a pad 311a and separation between the first a pad 311a and the insulation layers, so that it serves to improve a pad reliability.

Moreover, the above-mentioned connection part 333a and the first protective layer 331a may be integrally formed. Accordingly, the connection part 333a may connect the first fan-out line 210 and the first a protective layer 331a through the contact hole 323a formed in the second gate insulation layer 123 and the interlayer insulation layer 105 on the first fan-out line 210. The first protective layer 331a may directly contact the first a pad 311a. Since the first protective layer 331a may be formed of the above-mentioned conductive material, the first a pad 311a may be electrically connected to the first fan-out line 210 consequentially.

Then, referring to FIGS. 8 and 10, like the first a pad 311a, a second a pad 312a may be formed on the second gate insulation layer 123. Since the second fan-out line 220 may also be formed on the second gate insulation layer 123, the second a pad 312a and the second fan-out line 220 may be integrally formed. The interlayer insulation layer 105 may be formed on the second a pad 312a and the second fan-out line 220. Since the second a pad 312a needs to contact a driver IC (not shown), a second opening 322a may be formed in the interlayer insulation layer 105 on the second a pad 312a in order to expose the second a pad 312a.

The second a pad 312a may be formed of a metallic material, so that it may be vulnerable to corrosion or damage when being exposed. Accordingly, a second protective layer 332a may be formed on the second a pad 312a exposed by the second opening 322a.

The second protective layer 332a may cover portions of the second a pad 312a and the interlayer insulation layer 105, which may be exposed through the second opening 322a. The second protective layer 332a may help prevent corrosion of the second a pad 312a and separation between the second a pad 312a and the insulation layers, so that it serves to improve a pad reliability.

According to the present embodiment, like the previous embodiment, the bonding reliability of the pad and driver IC may be improved.

Moreover, the first protective layer 331, the first a protective layer 331a, the second protective layer 332, the second a protective layer 332a, and the connection parts 333 and 333a may be simultaneously formed when the data line DL is formed in the display area DA. Accordingly, they may be formed of the same material as the data line DL and on the same layer as the data line DL.

Moreover, an additional protective layer may be further formed on the first and second protective layers 331,332, 331a, and 332a shown in FIGS. 6, 7, 9, and 10. The additional protective layer may be formed of TCO, which may be one of an ITO, an IZO, a ZnO, an $In_2O_3$, an IGO, and an AZO, in order to help prevent the corrosion of a pad.

Moreover, although not shown in FIGS. 5 to 7, 9, and 10, the passivation layer 107 of FIG. 2 may be further formed on the first and second fan-out lines 210 and 220, in order to planarize the surface thereof and protect the lines below. Here, the passivation layer 107 of FIG. 2 may contain an inorganic substance such as a silicon oxide or a silicon nitride, or may contain at least one organic substance of polyimide, polyamide, acrylic resin, benzocyclobutene, and phenol resin.

By way of summation and review, a flat panel display device may include, on a substrate, a display area where an image is displayed and a non-display area around the display area. The non-display area may include pads contacting a driver IC and lines connecting the display area and the pads.

The driver IC may be bonded to the pads by using an adhesive containing conductive material. However, if insulation layers at the bottom of the pads have different thicknesses, a height difference between the pads may occur. Thus, bonding defects between the driver IC and the pads may occur.

According to an embodiment, by forming pads, which are connected to lines in different layers, on the same layer through a connection part, bonding defects between pads and a driver IC may be improved, i.e., reduced.

Additionally, according to an embodiment, lines in a non-display area may be alternately disposed in different layers in order to reduce an interval between lines. Thus, dead space may be minimized, and a fan-out part may be easily designed and used for a small panel or a high-resolution display device.

The embodiments provide a display device including pads in a non-display area around a display area where an image is displayed.

The embodiments provide a display device and organic light-emitting display device having a pad structure that helps improve, i.e., reduce, bonding defects.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
   a substrate;
   a first line on the substrate;
   a first pad electrically connected to the first line, the first pad being on a same layer as the first line;
   a second line on another layer different from the layer on which the first line is formed, an insulation layer being interposed between the first line and the second line;
   a second pad on a same layer as the first pad; and
   a connection part electrically connecting the second line and the second pad, wherein the display device includes a plurality of first lines and a plurality of second lines, the plurality of first lines being alternately disposed with respect to the plurality of second lines.

2. The display device of claim 1, wherein the display device includes a plurality of first pads and a plurality of second pads, the plurality of first pads being alternately disposed and staggered with respect to the plurality of second pads.

3. The display device of claim 1, wherein the first line and the first pad are integrally formed.

4. The display device of claim 1, further comprising:
first and second insulation layers, the first and second insulation layers including a first opening that exposes a portion of the first pad; and
a first protective layer covering the portion of the first pad exposed through the first opening.

5. The display device of claim 1, further comprising:
first and second insulation layers, the first and second insulation layers including a second opening that exposes a portion of the second pad; and
a second protective layer covering the portion of the second pad exposed through the second opening.

6. The display device of claim 5, wherein the second insulation layer covers the second line, the second insulation layer including a contact hole through which the connection part extends to connect to the second line.

7. The display device of claim 1, further comprising:
a first insulation layer including a first opening, the first opening exposing a portion of the first pad; and
a first protective layer covering the portion of the first pad exposed through the first opening.

8. The display device of claim 1, further comprising:
a first insulation layer including a second opening, the second opening exposing a portion of the second pad; and
a second protective layer covering the portion of the second pad exposed through the second opening.

9. The display device of claim 8, wherein
a second insulation layer and the first insulation layer are on the second line;
the first and second insulation layers include a contact hole through which the connection part extends to connect to the second line; and
the connection part and the second protective layer are integrally formed.

10. The display device of claim 1, wherein a side of each of the first line and the second line is connected to a display area where an image is displayed.

11. An organic light-emitting display device, comprising:
a substrate including:
a display area where an image is displayed, and
a non-display area around the display area;
a plurality of first gate lines in the display area, the plurality of first gate lines extending in a first direction;
a plurality of second gate lines in the display area, the plurality of second gate lines being insulated from the plurality of first gate lines by a first insulation layer and extending in the first direction;
a plurality of data lines in the display area, the plurality of data lines being insulated from the plurality of second gate lines by a second insulation layer and extending in a second direction intersecting the first direction;
a pixel including a pixel circuit, the pixel circuit being electrically connected to one of the data lines and one of the plurality of first gate lines or one of the plurality of second gate lines;
an organic light-emitting device included in the pixel, the organic light-emitting device being electrically connected to the pixel circuit and being configured to emit light;
pads in the non-display area;
lines connecting the pads and the display area, and
a connection part,
wherein:
the lines include first lines and second lines with an insulation layer therebetween, the second lines being on another layer different from a layer on which the first lines are formed,
the pads are electrically connected to the first lines and the second lines, the pads including a first pad on a same layer as the first lines and a second pad on a same layer as the first pad; and
the connection part electrically connects the second lines and the second pad.

12. The display device of claim 11, wherein the first lines are alternately disposed with respect to the second lines.

13. The display device of claim 11, wherein organic light-emitting display device includes a plurality of first pads and a plurality of second pads, the plurality of first pads being alternately disposed and staggered with respect to the plurality of second pads.

14. The display device of claim 11, wherein the first lines and the first pad are integrally formed.

15. The display device of claim 11, further comprising a first protective layer covering a portion of the first pad exposed through a first opening, wherein:
the first pad is on a same layer as the plurality of first gate lines;
the first and second insulation layers include the first opening that exposes the portion of the first pad.

16. The display device of claim 11, further comprising a second protective layer covering a portion of the second pad exposed through a second opening, wherein:
the second pad is on a same layer as the plurality of first gate lines;
the first and second insulation layers include the second opening that exposes the portion of the second pad.

17. The display device of claim 16, wherein:
the second lines are on a same layer as the plurality of second gate lines;
the second insulation layer includes a contact hole overlying the second lines and through which the connection part extends to connect to the second lines; and
the connection part and the second protective layer are integrally formed.

18. The display device of claim 11, further comprising a first protective layer covering a portion of the first pad exposed through a first opening, wherein:
the first pad is on a same layer as the plurality of second gate lines, and
the second insulation layer includes the first opening that exposes the portion of the first pad.

19. The display device of claim 11, further comprising a second protective layer covering a portion of the second pad exposed through a second opening, wherein:
the second pad is on a same layer as the plurality of second gate lines; and
the second insulation layer includes the second opening that exposes the portion of the second pad.

20. The display device of claim 19, wherein
the second line is on a same layer as the plurality of first gate lines;
the first and second insulation layers include a contact hole through which the connection part extends to connect to the second lines; and
the connection part and the second protective layer are integrally formed.

21. A display device, comprising:
a substrate;
a first line on the substrate;

a first pad electrically connected to the first line, the first pad being on a same layer as the first line;
a second line on another layer different from the layer on which the first line is formed, an insulation layer being interposed between the first line and the second line;
a second pad on a same layer as the first pad; and
a connection part electrically connecting the second line and the second pad, wherein the display device includes a plurality of first pads and a plurality of second pads, the plurality of first pads being alternately disposed and staggered with respect to the plurality of second pads.

* * * * *